(12) United States Patent
Jones

(10) Patent No.: US 7,831,404 B2
(45) Date of Patent: Nov. 9, 2010

(54) HISTOGRAM GENERATION WITH CONFIGURABLE MEMORY

(75) Inventor: Michael Frank Jones, Santa Clara, CA (US)

(73) Assignee: Advantest Corporation, Tokyo (JP)

(*) Notice: Subject to any disclaimer, the term of this patent is extended or adjusted under 35 U.S.C. 154(b) by 316 days.

(21) Appl. No.: 11/876,691

(22) Filed: Oct. 22, 2007

(65) Prior Publication Data

US 2009/0105992 A1  Apr. 23, 2009

(51) Int. Cl.
*G01R 27/28* (2006.01)
(52) U.S. Cl. ........................ 702/117; 702/180
(58) Field of Classification Search ............ 702/78, 702/117, 118, 120, 180, 187; 341/120, 121, 341/94
See application file for complete search history.

(56) References Cited

U.S. PATENT DOCUMENTS 5,063,383 A * 11/1991 Bobba ..................... 341/120
5,294,926 A * 3/1994 Corcoran .................. 341/120

* cited by examiner

*Primary Examiner*—Manuel L Barbee
(74) *Attorney, Agent, or Firm*—Morrison & Foerster LLP

(57) ABSTRACT

The configuration and utilization of multiple memories is disclosed to efficiently gather histogram data for either multiple devices or single devices. Each memory can be configured depending on the number of ADCs to be tested. Rather than utilizing a separate histogram engine for each ADC, or duplicate memories to test each ADC, the memory of each histogram engine can be used either for a single ADC having a large or otherwise substantial sample width, or for multiple ADCs, each having a smaller sample width. To accomplish this, the memory is partitioned into multiple segments using address decoding such that a single ADC can use all of the segments for histogram data collection, while multiple ADCs can each use one of the segments for histogram data collection.

21 Claims, 3 Drawing Sheets

PRIOR ART

HISTOGRAM GENERATION WITH CONFIGURABLE MEMORY

FIELD OF THE INVENTION

This invention relates to the generation of histograms, and more particularly, to configuring and utilizing multiple memories to efficiently gather histogram data for either multiple devices or a single device.

BACKGROUND OF THE INVENTION

Certain semiconductor devices capable of generating a semi-predictable multi-bit output in response to a known input stimulus can be tested by applying the known stimulus over a fixed period of time, and capturing the number of occurrences of particular multi-bit outputs during that time. Each particular multi-bit output being monitored may be referred to as a "bin," and the number of counts in each bin at the conclusion of the fixed test period can be used to generate a histogram. The histogram can be used in various ways (e.g. numerical analysis) to determine if the device under test (DUT) is acceptable or not, or determine performance parameters.

One such device capable of being tested in the above-described manner is an ADC. An ADC generates a multi-bit output (also referred to herein as a "code") in response to an analog input signal. A common input stimulus used for testing ADCs is a sine wave, which is relatively easily generated in a "clean" manner (substantially free of spurious frequencies). When the sine wave is applied to the input of the ADC, the input signal varies between a minimum and maximum analog voltage level, and the ADC outputs a multi-bit digital signal in accordance with the analog voltage level. Over time, a histogram can be generated indicative of the acceptability of the ADC.

FIG. 1a illustrates an exemplary block diagram of a high level perspective of test system 100 that may be used to test DUTs and generate histograms as described above. It should be emphasized that FIG. 1a is only exemplary, and that many other test system configurations well-understood to those skilled in the art may also be used. In FIG. 1a, modules 102 may be functional units such as a reference generator, a digital pincard, an analog card, a device power supply (DPS), or instruments such as a waveform generator. The physical connections to modules 102 may be obtained through module connection enabler 104 that includes switch matrix network 106. Switch matrix network 106 may include logic, traces, and pins.

System controller 108 is typically the point of interaction for a user. System controller 108 provides a gateway to site controllers 110 and synchronization of the site controllers in a multi-site/multi-DUT environment. A system controller 108 and multiple site controllers 110 may operate in a master-slave configuration. System controller 108 controls the overall system operation and determines that functions that a particular site controller 110 should perform. Each site controller 110 is itself sufficient to test DUT 112. Site controller 110 controls and monitors the operation of various modules 102 within test site 114. Test site 114 is a collection of modules 102 that service the testing of a single DUT 112. Site controller 110 can control one or multiple test sites 114.

As described above, an input stimulus such as a sine wave may be supplied from a reference generator module (one of the modules 102 in test site 114) to DUT 112. A multi-bit output from the DUT can be fed back to another module 102, where a count of each multi-bit output received from the DUT is accumulated.

FIG. 1b illustrates exemplary test site 114 and DUT 112 in greater detail. In FIG. 1b, DUT 112 is an ADC, and module 102_A generates a sine wave that is fed into the input of the ADC. The ADC generates an N-bit digital output, which is connected to the address line of memory 116 within module 102_B. At every sample of the ADC, the N-bit digital output addresses memory 116, and the count stored at that address is read out, modified (incremented by one), and written back to that address (a read-modify-write or RMW cycle). As shown by exemplary plot 118, in a typical ADC, a sine wave input will result in a nonlinear distribution of counts, with a high number of counts at a small number of minimum and maximum codes/addresses (corresponding to the minimum and maximum values of the sine wave, where the sine wave inflects), and a low number of counts at a large majority of the other addresses (corresponding to those regions where the sine wave is transitioning from low-to-high or from high-to-low). The high number of counts may be hundreds or thousands of times higher than the low number of counts.

If a single memory is used to maintain the counts for all codes/addresses, each address in that memory (i.e. each bin) must be capable of counting up to the maximum number of occurrences expected for any address during the test. In other words, each bin must be capable of storing the highest count expected in any of the bins. This configuration is wasteful of memory resources, however, because as plot 118 demonstrates, most of the bins will store a much lower count.

In addition, some DUTs may contain more than one semiconductor device capable of generating a predictable multi-bit output in response to a known input stimulus. It is often desirable to test each of these devices (e.g. multiple ADCs) in parallel. To accomplish this, multiple memories may be provided at the test site, one for each possible ADC that may be tested in parallel. However, this configuration can be wasteful of memory resources, especially when the test is changed and a DUT with only a single ADC is being tested.

Therefore, there is a need to be able to configure and utilize multiple memories to efficiently gather histogram data for either multiple devices or single devices.

SUMMARY OF THE INVENTION

Embodiments of the invention are directed to configuring and utilizing multiple memories to efficiently gather histogram data for either multiple devices or single devices. Each memory can be configured depending on the number of ADCs to be tested. Rather than utilizing a separate histogram engine for each ADC, or duplicate memories to test each ADC, the memory of each histogram engine can be used either for a single ADC having a large or otherwise substantial sample width, or for multiple ADCs, each having a smaller sample width. To accomplish this, the memory is partitioned into multiple segments using address decoding such that a single ADC can use all of the segments for histogram data collection, while multiple ADCs can each use one of the segments for histogram data collection.

In some embodiments of the invention, one segment of the partitioned memory may be a narrower but deeper memory for counting codes having a higher number of occurrences, while another segment of the partitioned memory may be a wider but shallower memory for counting codes having a lower number of occurrences.

DETAILED DESCRIPTION OF THE PREFERRED EMBODIMENT

Figure 1A:
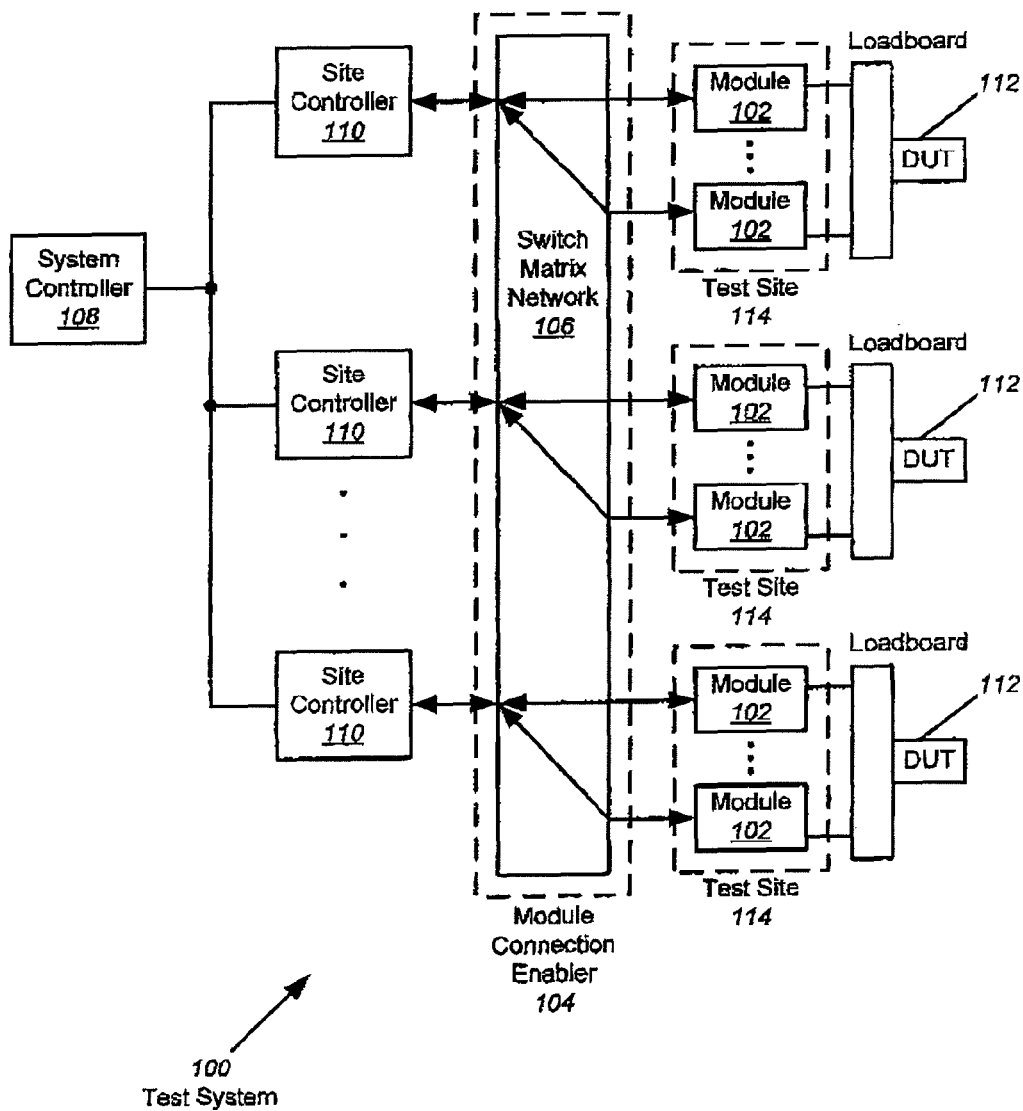
FIG. 1a illustrates an exemplary block diagram of a test system that may be used to test DUTs and generate histograms.
Figure 1B:
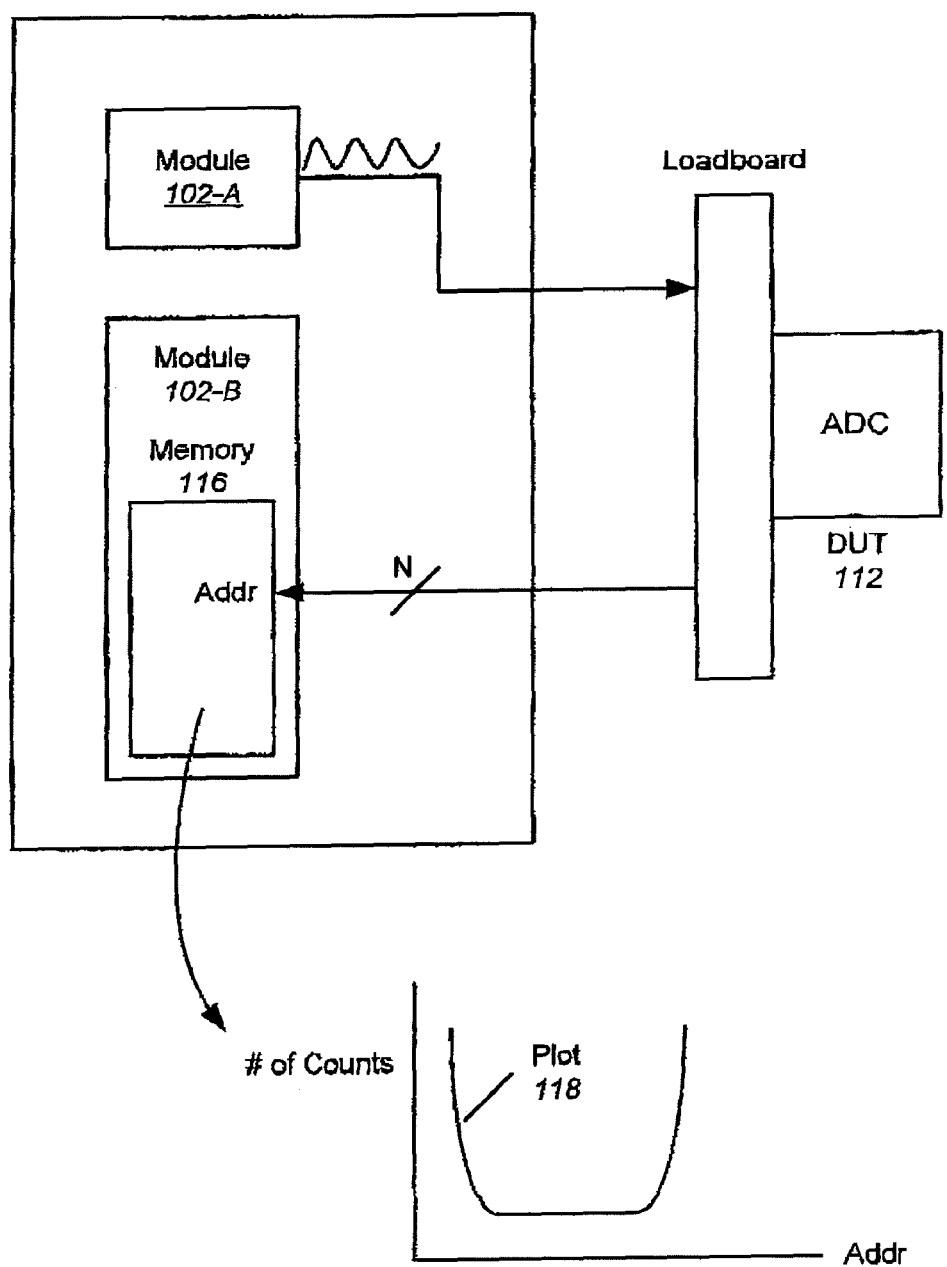
FIG. 1b illustrates an exemplary test site including modules for generating a sine wave and counting the number of occurrences of particular output codes.

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Embodiments of the invention are directed to configuring and utilizing multiple memories to efficiently gather histogram data for either multiple devices or single devices. Each memory can be configured depending on the number of ADCs to be tested. Rather than utilizing a separate histogram engine for each ADC, or duplicate memories to test each ADC, the memory of each histogram engine can be used either for a single ADC having a large or otherwise substantial sample width, or for multiple ADCs, each having a smaller sample width. To accomplish this, the memory is partitioned into multiple segments using address decoding such that a single ADC can use all of the segments for histogram data collection, while multiple ADCs can each use one of the segments for histogram data collection.

In some embodiments of the invention, one segment of the partitioned memory may be a narrower but deeper memory for counting codes having a higher number of occurrences, while another segment of the partitioned memory may be a wider but shallower memory for counting codes having a lower number of occurrences.

It should be understood that although the present invention may be described herein in the context of testing one or more ADCs being driven with sine waves for purpose of illustration only, embodiments of the present invention are applicable to any device capable of generating a predictable multi-bit output in response to any known input stimulus, and are also applicable to the gathering of histogram data in non-test situations as well.

In a conventional test system, there are a limited number of automatic test equipment (ATE) pins or channels dedicated to histogram processors (engines). Each histogram engine contains circuitry for capturing histogram data for an ADC, including sufficient memory to handle an ADC having a substantial sample width (e.g. a 24-bit output).

However, some DUTs include multiple ADCs in a single package, such as for video applications (e.g. one ADC for each of red (R), green (G) and blue (B) processing). Typically, when multiple ADCs are contained in a single package, the sample width of each ADC (i.e. the number of bits in the output) is less than the sample width of a single ADC.

It is often desirable to test all of the multiple ADCs in parallel to save test time. However, because only a limited number of histogram engines may be available, each histogram engine may need to contain duplicate circuitry and memories so that histogram data can be captured for multiple ADCs in parallel. Nevertheless, it may not be practical to design each histogram engine to have the capability of testing multiple ADCs having a large or substantial sample width in parallel, especially when most multiple ADCs have smaller sample widths. In practice, if each of the multiple ADCs being tested does not have a large or sample width, or only one ADC is actually tested at any one time, then some of the memory in each histogram engine will be unused.

Figure 2:
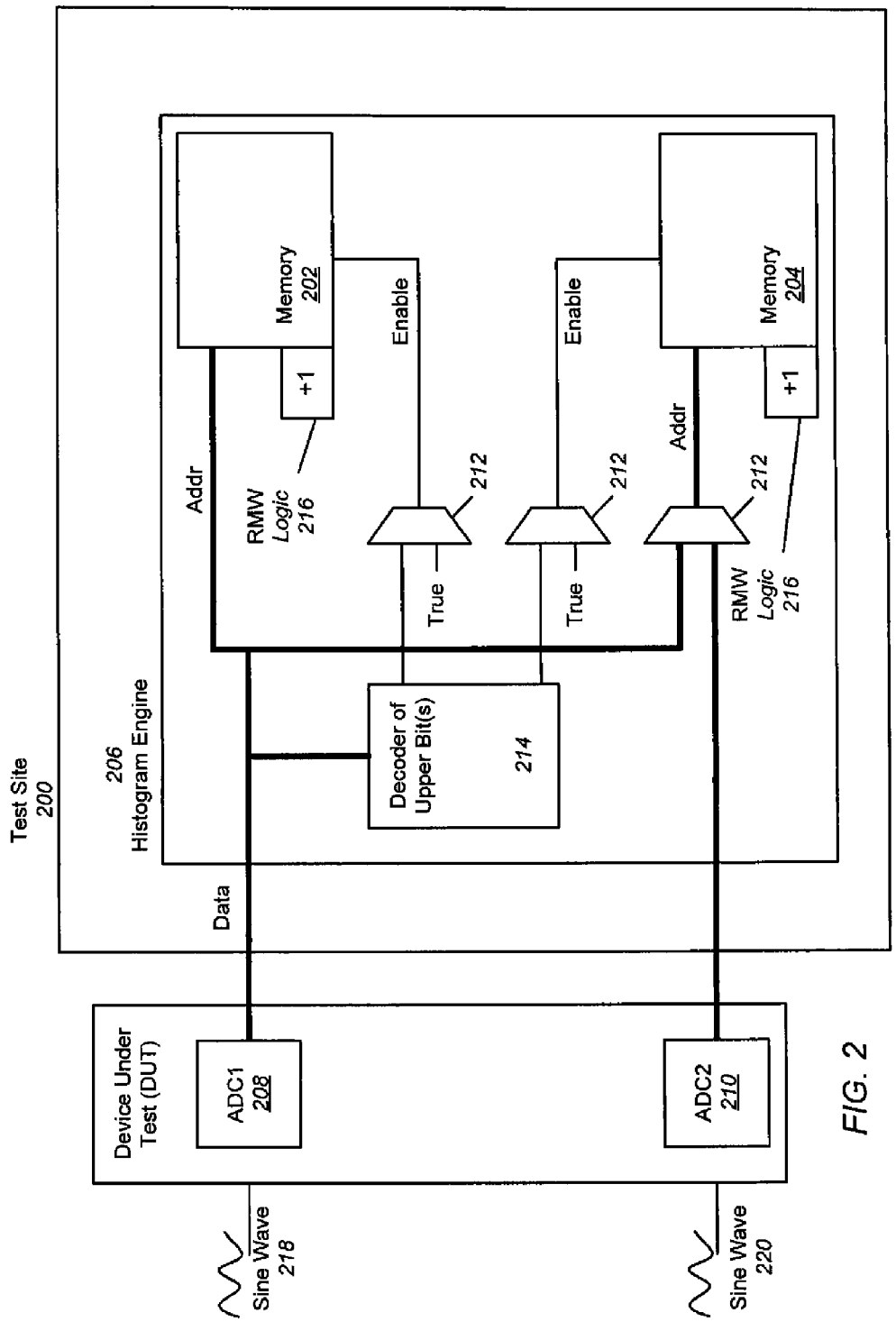
FIG. 2 illustrates an exemplary test site employing multiple memories for gathering histogram data, each of which can be configured depending on the number of ADCs to be tested according to embodiments of the invention.

FIG. 2 illustrates an exemplary test site 200 employing multiple memories 202 and 204 within a histogram engine 206 for gathering histogram data, each of which can be configured depending on the number of ADCs to be tested in parallel according to embodiments of the invention. In FIG. 2, rather than utilizing a separate histogram engine for each ADC, or duplicate memories to test each ADC, the memory of each histogram engine 206 can be used either for a single ADC having a large or substantial sample width, or for multiple ADCs, each having a smaller sample width. To accomplish this, the memory is partitioned into multiple segments using address decoding such that a single ADC can use all of the segments for histogram data collection, while multiple ADCs can each use one of the segments for histogram data collection.

In FIG. 2, if the test site 200 is configured to test multiple ADCs in parallel, one or more sine waves 218 and 220 may be fed into multiple ADCs 208 and 210, and the lower input of each multiplexer 212 is selected. In this configuration, the memories 202 and 204 are always enabled, and the output codes from ADCs 208 and 210 are coupled to the address lines of memories 202 and 204, respectively, regardless of the operation of decoder 214. Thus, memory 202 counts the occurrences of the codes output from ADC 208 using RMW logic 216, and memory 204 independently counts the occurrences of the codes output from ADC 210 using RMW logic 216.

If the test site 200 is configured to test only a single ADC, a sine wave may be fed into ADC 208, and the upper input of each multiplexer 212 is selected. In this configuration, decoder 214 decodes the upper bits of the code output by ADC 208, and either memory 202 or memory 204 is enabled based on the output from the decoder. In other words, an effective offset is produced by decoder 214 decoding the upper bits of the output from ADC 208. Decoder 214 and multiplexers 212 together may be referred to herein as decoding logic. If memory 202 is enabled, memory 202 counts the occurrences of the codes output from ADC 208 using RMW logic 216, and if memory 204 is enabled, memory 204 counts the occurrences of the codes output from ADC 208 using RMW logic 216. Thus, memories 202 and 204 act a single memory, and together count the occurrences of the codes output from ADC 208.

In some embodiments of the invention, memory 202 may be a narrower but deeper memory for counting codes having a higher number of occurrences, while memory 204 may be a wider but shallower memory for counting codes having a lower number of occurrences.

Although FIG. 2 illustrates only two separate memories 202 and 204 for purposes of illustration, the logic design of FIG. 2 can be extended to more than two memories in a straightforward manner well-understood to those skilled in the art. In addition, it should be noted that the use of multiplexers 212 and decoder 214 (decoding logic) as shown in FIG. 2 is only exemplary, and that other decoding logic designs easily produced by those skilled in the art may be employed to achieve the same result, which is to configure multiple memory segments to gather histogram data for either a single ADC or multiple ADCs.

It should also be understood by those skilled in the art that FIG. 2 is simplified for purposes of clarity, and that various elements such as a clock distribution network to the decoder, RMW logic and memories, and access paths to the memories so that histogram results can be retrieved, are not shown in the figures. In addition, a mechanism for clearing the memories is needed to clear them prior to the start of a test.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An apparatus for gathering histogram data from one or more devices under test (DUTs), comprising:
   a plurality of memories configured for receiving a digital output from one or more of the DUTs as an address and performing a read-modify-write (RMW) cycle on a count stored at that address, at least one of the plurality of memories being a first memory having fewer addressable locations than the other memories but capable of storing a higher count than the other memories; and
   decoding logic coupled to the plurality of memories, the decoding logic configurable for routing the digital output from each of the one or more DUTs to a separate memory when there are a plurality of DUTs, and receiving the digital output from one DUT and selectively routing the digital output from the one DUT to a particular one of the memories in accordance with the received digital output when there is only a single DUT.

2. The apparatus of claim 1, wherein the decoding logic is configured for routing the digital output to the first memory for those digital outputs for which a higher number of occurrences are expected during a test period, and routing the digital output to one of the other memories for those digital outputs for which a lower number of occurrences are expected during the test period.

3. The apparatus of claim 1, wherein the one DUT is an analog to digital converter (ADC) and the input to the ADC is a sine wave, and the decoding logic is configured for routing the digital output from the ADC to the at least one memory having the fewest addressable locations but capable of storing a higher count for the digital outputs corresponding to inflection points of the sine wave, and routing the digital output to the other memories for all other digital outputs.

4. A test site comprising the apparatus of claim 1.

5. A test system comprising the test site of claim 4.

6. An apparatus for gathering histogram data from one or more devices under test (DUTs), comprising:
   a plurality of memories configured for receiving a digital output from one or more of the DUTs as an address and performing a read-modify-write (RMW) cycle on a count stored at that address; and
   decoding logic coupled to the plurality of memories, the decoding logic configurable for routing the digital output from each of the one or more DUTs to a separate memory when there are a plurality of DUTs, and receiving the digital output from one DUT and selectively routing the digital output from the one DUT to a particular one of the memories in accordance with the received digital output when there is only a single DUT,
   wherein the decoding logic effectively applies an address offset to the received digital output from the one DUT to selectively route the digital output to one of the memories.

7. An apparatus for gathering histogram data from one or more devices under test (DUTs), comprising:
   a plurality of memories configured for receiving a digital output from one or more of the DUTs as an address and performing a read-modify-write (RMW) cycle on a count stored at that address; and
   decoding logic coupled to the plurality of memories, the decoding logic configurable for routing the digital output from each of the one or more DUTs to a separate memory when there are a plurality of DUTs, and receiving the digital output from one DUT and selectively routing the digital output from the one DUT to a particular one of the memories in accordance with the received digital output when there is only a single DUT,
   wherein the decoding logic selectively routes the digital output from the one DUT to one of the memories in accordance with upper bits of the received digital output.

8. A histogram engine for gathering histogram data from one or more devices under test (DUTs), comprising:
   a memory space divided into a plurality of segments in a parallel configuration, each segment configured for receiving a digital output from one or more of the DUTs as an address and performing a read-modify-write (RMW) cycle on a count stored at that address, at least one of the plurality of segments being a first segment having fewer addressable locations than the other segments but capable of storing a higher count than the other segments; and
   decoding logic coupled to the plurality of memory segments, the decoding logic configurable for either enabling each of the plurality of segments to gather histogram data for a separate one of the DUTs, or routing the digital output from one DUT to a particular one of the memory segments in accordance with the received digital output.

9. The histogram engine of claim 8, wherein the decoding logic isb configured for routing the digital output to the first segment for those digital outputs for which a higher number of occurrences are expected during a test period, and routing the digital output to one of the other segments for those digital outputs for which a lower number of occurrences are expected during the test period.

10. The histogram engine of claim 8, wherein the one DUT is an analog to digital converter (ADC) and the input to the ADC is a sine wave, and the decoding logic is configured for routing the digital output from the ADC to the first segment having the fewest addressable locations but capable of storing a higher count for the digital outputs corresponding to inflection points of the sine wave, and routing the digital output to the other segments for all other digital outputs.

11. A test site comprising the histogram engine of claim 8.

12. A test system comprising the test site of claim 11.

13. A histogram engine for gathering histogram data from one or more devices under test (DUTs), comprising:
   a memory space divided into a plurality of segments in a parallel configuration, each segment configured for receiving a digital output from one or more of the DUTs as an address and performing a read-modify-write (RMW) cycle on a count stored at that address; and decoding logic coupled to the plurality of memory segments, the decoding logic configurable for either enabling each of the plurality of segments to gather histogram data for a separate one of the DUTs, or routing the digital output from one DUT to a particular one of the memory segments in accordance with the received digital output, wherein the decoding logic effectively applies an address offset to the received digital output from the one DUT to selectively route the digital output to one of the segments.

14. A histogram engine for gathering histogram data from one or more devices under test (DUTs), comprising:

a memory space divided into a plurality of segments in a parallel configuration, each segment configured for receiving a digital output from one or more of the DUTs as an address and performing a read-modify-write (RMW) cycle on a count stored at that address; and decoding logic coupled to the plurality of memory segments, the decoding logic configurable for either enabling each of the plurality of segments to gather histogram data for a separate one of the DUTs, or routing the digital output from one DUT to a particular one of the memory segments in accordance with the received digital output, wherein the decoding logic selectively routes the digital output from the one DUT to one of the segments in accordance with upper bits of the received digital output.

15. A method for gathering histogram data from one or more devices under test (DUTs), comprising:

routing a digital output from each DUT to a separate one of a plurality of memories when there are a plurality of DUTs;

routing the digital output from a single DUT to a particular one of the plurality of memories in accordance with the digital output when there is only a single DUT;

for each of the plurality of memories, performing a read-modify-write (RMW) cycle on a count stored at an address corresponding to the received digital output; and including a first memory in the plurality of memories having fewer addressable locations than the other memories but capable of storing a higher count than the other memories.

16. The method of claim 15, further comprising routing the digital output to the first memory for those digital outputs for which a higher number of occurrences are expected during a test period and routing the digital output to one of the other memories for those digital outputs for which a lower number of occurrences are expected during the test period when there is only a single DUT.

17. A method for gathering histogram data from one or more devices under test (DUTs), comprising:

routing a digital output from each DUT to a separate one of a plurality of memories when there are a plurality of DUTs;

routing the digital output from a single DUT to a particular one of the plurality of memories in accordance with the digital output when there is only a single DUT;

for each of the plurality of memories, performing a read-modify-write (RMW) cycle on a count stored at an address corresponding to the received digital output; and applying an address offset to the digital output received from the one DUT to selectively route the digital output to the particular one of the plurality memories when there is only a single DUT.

18. A method for gathering histogram data from one or more devices under test (DUTs), comprising:

routing a digital output from each DUT to a separate one of a plurality of memories when there are a plurality of DUTs;

routing the digital output from a single DUT to a particular one of the plurality of memories in accordance with the digital output when there is only a single DUT;

for each of the plurality of memories, performing a read-modify-write (RMW) cycle on a count stored at an address corresponding to the received digital output; and selectively routing the digital output from the one DUT to the particular one of the plurality of memories in accordance with upper bits of the digital output when there is only a single DUT.

19. A method for gathering histogram data from one or more devices under test (DUTs), comprising:

dividing a memory space into a plurality of segments in a parallel configuration, each segment configured for receiving a digital output from one or more of the DUTs as an address and performing a read-modify-write (RMW) cycle on a count stored at that address;

enabling each of the plurality of segments to gather histogram data for a separate one of the DUTs when there are a plurality of DUTs;

routing the digital output from one DUT to a particular one of the memory segments in accordance with the received digital output where there is only a single DUT; and including a first segment in the plurality of segments having fewer addressable locations than the other memories but capable of storing a higher count than the other memories.

20. The method of claim 19, further comprising routing the digital output to the first segment for those digital outputs for which a higher number of occurrences are expected during a test period and routing the digital output to one of the other segments for those digital outputs for which a lower number of occurrences are expected during the test period when there is only a single DUT.

21. A method for gathering histogram data from one or more devices under test (DUTs), comprising:

dividing a memory space into a plurality of segments in a parallel configuration, each segment configured for receiving a digital output from one or more of the DUTs as an address and performing a read-modify-write (RMW) cycle on a count stored at that address;

enabling each of the plurality of segments to gather histogram data for a separate one of the DUTs when there are a plurality of DUTs;

routing the digital output from one DUT to a particular one of the memory segments in accordance with the received digital output where there is only a single DUT; and applying an address offset to the digital output received from the one DUT to selectively route the digital output to the particular one of the plurality segments when there is only a single DUT.

* * * * *